(12) United States Patent
Fortier et al.

(10) Patent No.: US 7,570,710 B1
(45) Date of Patent: Aug. 4, 2009

(54) IN-PHASE AND QUADRATURE-PHASE SIGNAL AMPLITUDE AND PHASE CALIBRATION

(75) Inventors: Richard Jacques Fortier, San Diego, CA (US); Wing Fat Andy Lau, San Diego, CA (US); Peter Jivan Shah, San Diego, CA (US)

(73) Assignee: RF Magic, Inc., San Diego, CA (US)

( * ) Notice: Subject to any disclaimer, the term of this patent is extended or adjusted under 35 U.S.C. 154(b) by 651 days.

(21) Appl. No.: 11/300,046

(22) Filed: Dec. 14, 2005

Related U.S. Application Data

(60) Provisional application No. 60/636,383, filed on Dec. 15, 2004.

(51) Int. Cl.
*H04K 1/02* (2006.01)
(52) U.S. Cl. .............. 375/297; 375/296; 375/295; 455/126; 455/127.3; 455/114.2
(58) Field of Classification Search ............ 375/297, 375/347, 324, 235; 455/90.2, 302, 126; 398/140; 331/37
See application file for complete search history.

(56) References Cited

U.S. PATENT DOCUMENTS

| | | | | |
|---|---|---|---|---|
| 6,137,999 | A * | 10/2000 | Lovelace et al. | 455/302 |
| 6,377,620 | B1 * | 4/2002 | Ozluturk et al. | 375/235 |
| 6,404,293 | B1 * | 6/2002 | Darabi et al. | 331/37 |
| 6,895,045 | B2 * | 5/2005 | Ozluturk et al. | 375/235 |
| 7,061,994 | B2 * | 6/2006 | Li et al. | 375/316 |
| 7,110,481 | B2 * | 9/2006 | Yang | 375/347 |
| 2005/0069055 | A1 * | 3/2005 | Song et al. | 375/324 |
| 2005/0157813 | A1 * | 7/2005 | Cope et al. | 375/297 |
| 2007/0049219 | A1 * | 3/2007 | Demir et al. | 455/126 |
| 2007/0275674 | A1 * | 11/2007 | Chien | 455/90.2 |
| 2008/0145063 | A1 * | 6/2008 | Li et al. | 398/140 |
| 2008/0159442 | A1 * | 7/2008 | Tanabe et al. | 375/324 |
| 2008/0191313 | A1 * | 8/2008 | Rofougaran et al. | 257/532 |

* cited by examiner

*Primary Examiner*—Sudhanshu C Pathak
(74) *Attorney, Agent, or Firm*—Michael W. Landry; Bruce W. Greenhaus

(57) ABSTRACT

In-phase (I) and quadrature-phase (Q) signals are corrected for both amplitude and phase imbalances by passing the I and Q signals successively through a first amplitude correction stage, a sum-difference stage, and a second amplitude correction stage. The first amplitude correction stage balances the signal levels of the I and Q signals. The sum-difference stage produce a sum of the input I and Q signals, and a difference of the input I and Q signals, resulting in ideal quadrature in the outputs produced. The second amplitude correction stage corrects the amplitude differences from the sum-difference stage. Circuit configurations are used that minimize errors produced by the signal processing stages.

7 Claims, 10 Drawing Sheets

IN-PHASE AND QUADRATURE-PHASE SIGNAL AMPLITUDE AND PHASE CALIBRATION

RELATED APPLICATIONS

This application claims priority from U.S. provisional application No. 60/636,383 filed Dec. 15, 2004 entitled "In-phase and Quadrature-phase Signal Amplitude and Phase Calibration", incorporated herein by reference.

BACKGROUND

In receivers and transmitters, complex signals are often represented as two real signals denoted in-phase (I) and quadrature-phase (Q). The complex signal is then given as $S=I+jQ$ where $j=\sqrt{-1}$. Referring to FIG. 1, the typical well-known quadrature receiver architecture is shown wherein RF signal 100 is down converted to I/Q signals 101, which can a baseband frequency or an IF frequency (such as in so-called "low-IF" receivers).

In FIG. 1, down conversion is illustrated for the case where the down conversion is to baseband. Spectrum of RF signal 102, the spectrum of local oscillator (LO) tone 103, and the resulting down converted spectrum 104 of $S=I+jQ$ is shown. The desired result is a frequency translation of the signal spectrum but as spectrum 104 shows, there will also be an undesired image signal 105, shown hatched. This is a mirror-imaged (spectrally inverted) and attenuated version of the desired signal. The image is cause by amplitude and phase imbalances between the I and Q mixing paths. Usually the phase difference is caused by imperfections in the 90-degree phase split for the I and Q LO signals.

Up conversion from baseband I and Q signals to an IF or RF signal can also create an undesired image even when the LO signals driving the mixers are in perfect quadrature and amplitude balance. If the I and Q signals are not amplitude and phase balanced, a spectrally inverted image is present in the IF/RF and overlays the desired IF/RF signal.

It is desirable to reduce the image as much as possible and to this end it may be necessary calibrate the I and Q signals so as to suppress amplitude and phase errors. The calibration mechanism should preferably be continuous so that it can track changing amplitude and phase errors during without interrupting reception. The errors tend to drift during reception due to factors such as temperature, receive signal level, etc.

The conceptually most obvious way of adjusting the amplitude error is simply to insert a variable gain amplifier in either the I or Q path or both. Similarly, the phase error can be corrected by introducing a variable phase adjustment in series with the 90 degree LO splitter. This leaves the challenge of devising a method for measuring amplitude and phase differences between I and Q accurately and using that information to drive the correction circuitry. The implementation of phase correction and, in particular, accurate phase measurement is very challenging, especially under the constraint of continuous calibration because the properties of the received signal are in most cases unknown and therefore many well-known techniques such as zero-crossing detection are not applicable.

Lui, U.S. Pat. No. 6,560,449, entitled "Image rejection I/Q demodulators", issued May 6, 2003 discloses a feedback technique for reducing the image response of a receiver. The image/signal ratio is measured on the demodulator I/Q mixer outputs by detecting the phase and amplitude differences of the I and Q demodulated signals, then amplitude and phase control is applied to the quadrature LO generator driving the I and Q mixers to reduce the image response. The image/signal detector is calibrated during interstitial intervals between data packets. This approach requires interruption of the primary signal demodulation for calibration of the detector and a phase and amplitude adjustable LO generator.

For these reasons, it would be desirable if the I/Q phase and amplitude balance could be corrected without needing phase measurement or correction. Furthermore, it would be advantageous if this technique could be implemented entirely at the I/Q signals without requiring any intervention into the sensitive RF circuits.

SUMMARY OF THE INVENTION

This invention allows for I and Q phase and amplitude balance without using challenging phase measurements or corrections. The technique of the invention can be performed at the intermediate frequency (IF) I/Q or baseband I/Q signals without altering the RF circuitry and without processing at RF frequencies. The I and Q signals are initially passed through an amplitude equalization block that balances the signal levels between I and Q. The phase error is then corrected by a sum-difference circuit, where new vectors are created from the sum and difference of the I and Q signals. The resulting signals are in quadrature phase relationship, with a new amplitude imbalanced introduced. Amplitude balancing is again performed by passing the phase corrected I and Q signals through a second amplitude equalization block. The final results are I and Q signals that have quadrature-phase relationship and are equal in amplitude. By having the I and Q signals balanced, the undesired spectral image in the signal is reduced. The phase and amplitude balance can be applied to I and Q signals after down conversion from RF in a receiver or prior to up conversion to RF in a transmitter.

DETAILED DESCRIPTION OF INVENTION

Figure 1:
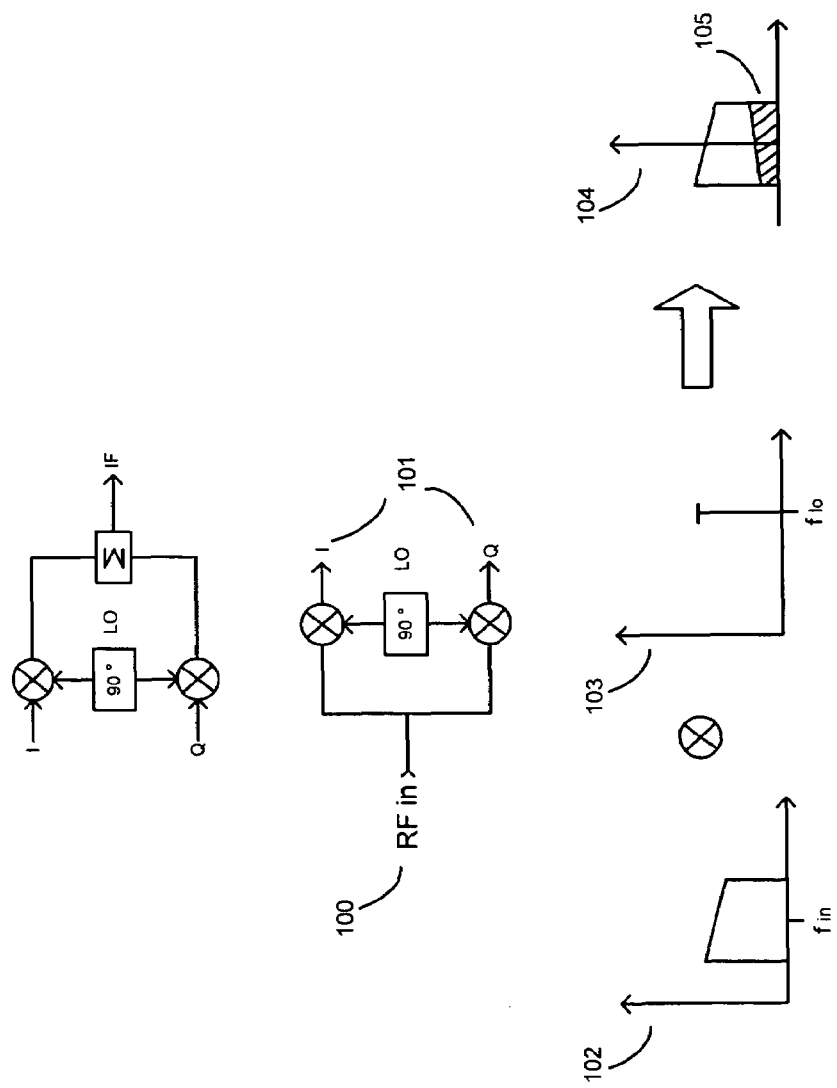
FIG. 1 shows prior art quadrature receiver architecture, quadrature up conversion, and illustration of the creation of an image signal during down conversion or up conversion.
Figure 2:
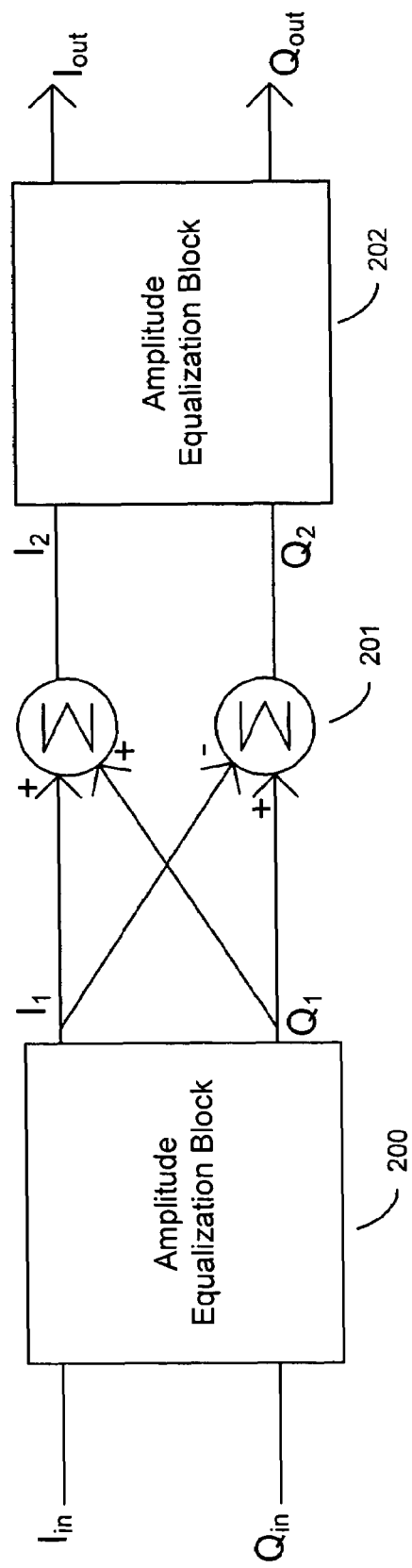
FIG. 2 shows a block diagram of the calibration method of the present invention.

FIG. 2 shows the principle of operation of the present invention. Amplitude-equalizing stage 200 is cascaded with a sum-difference circuit 201 and a second amplitude-equalizing stage 202. The result is I/Q calibration to null both the phase and amplitude imbalances.

Figure 3:
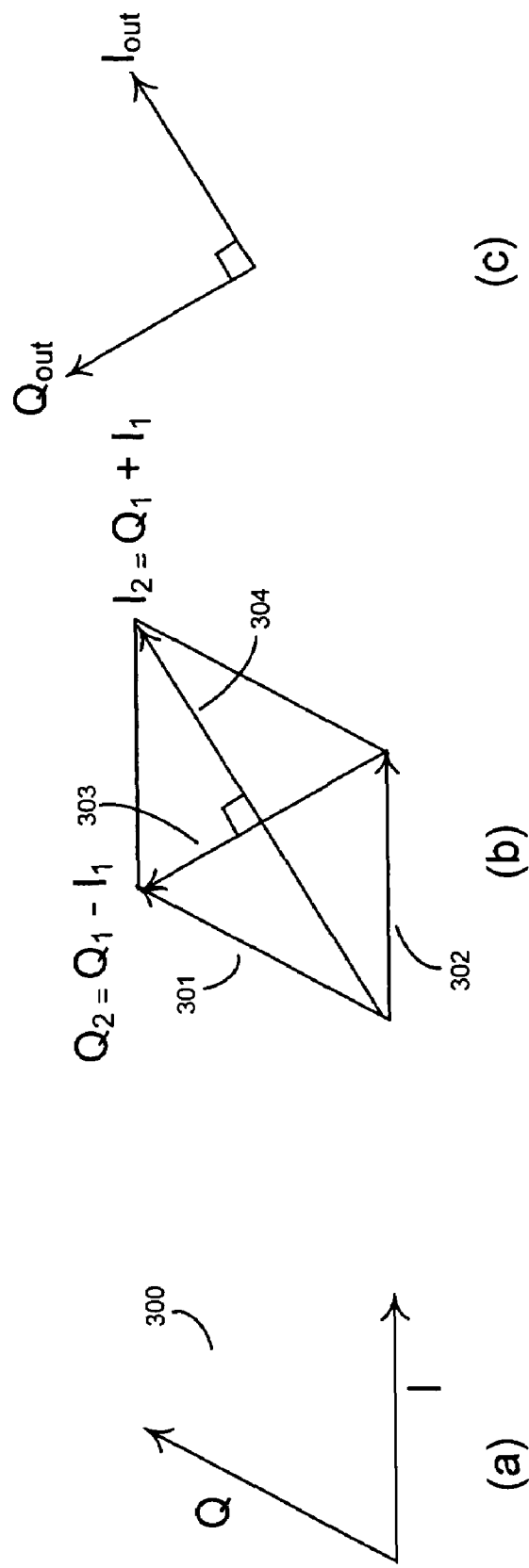
FIG. 3 shows the geometric manipulation of I and Q vectors to restore quadrature and balance amplitude.

As illustrated in FIG. 3a, incoming I and Q signals 300 have phase and amplitude errors and are not in perfect quadrature, i.e. when represented as vectors in the complex plane they are not of equal length and are not perpendicular.

In FIG. 3b vector $I_1$ 302 and vector $Q_1$ 301 are the amplitude balanced vectors of the original incoming I and Q signals. Vector $Q_2$ 303 is the difference of $Q_1$ and $I_1$ and vector $I_2$ 304 is the sum of $Q_1$ and $I_1$. Vectors $Q_2$ and $I_2$ are quadrature-phase but of unequal amplitude. A second amplitude equalization block corrects vectors $Q_2$ and $I_2$ to result in $Q_{out}$ and $I_{out}$ signals, which are balanced in amplitude and are quadrature-phased, as illustrated in FIG. 3c.

Figure 4:
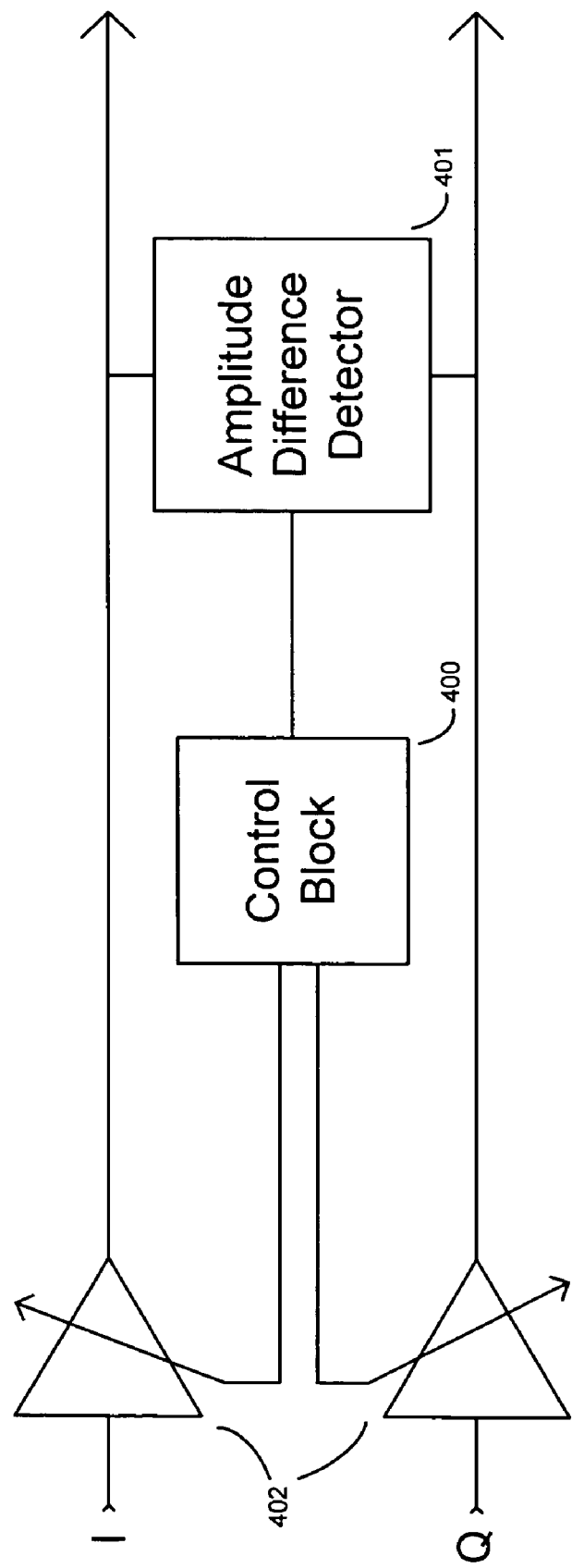
FIG. 4 shows a block diagram of an amplitude equalization block for use with the present invention.

FIG. 4 shows an example of an amplitude equalization block, which can be implemented as a loop that measures the amplitude difference between I and Q using amplitude difference detector 401 and controls via control block 400 either one or two variable gain amplifiers 402. Alternatively variable attenuators may be used or a combination of gain and attenuation. The amplitude balancing requires variability in either the I or the Q path but for symmetry reasons it may be desirable to use the same variable block in both paths, controlled in opposite directions.

This amplitude balancing and signal sum-differencing for I/Q calibration may be carried out in the analog domain, in the digital domain, or in a combination thereof. In an analog-focused implementation the I and Q signals would be analog as well as the variable gain or attenuator blocks and the amplitude difference detectors.

In a digital-focused implementation the I and Q, signals would be digital signals, for example, a digitized version of analog signals, and the aforementioned blocks would be digital circuits. The digital-focused implementation has the benefit of high precision and accuracy in the signal processing circuit blocks. Thus, the amplitude difference can easily be detected without measurement error. This can, for example, be done by digital peak detection of I and Q followed by subtraction. Similarly, in a digital implementation the sum-difference block can be implemented with no mismatch in gain between the summation paths.

Figure 5:
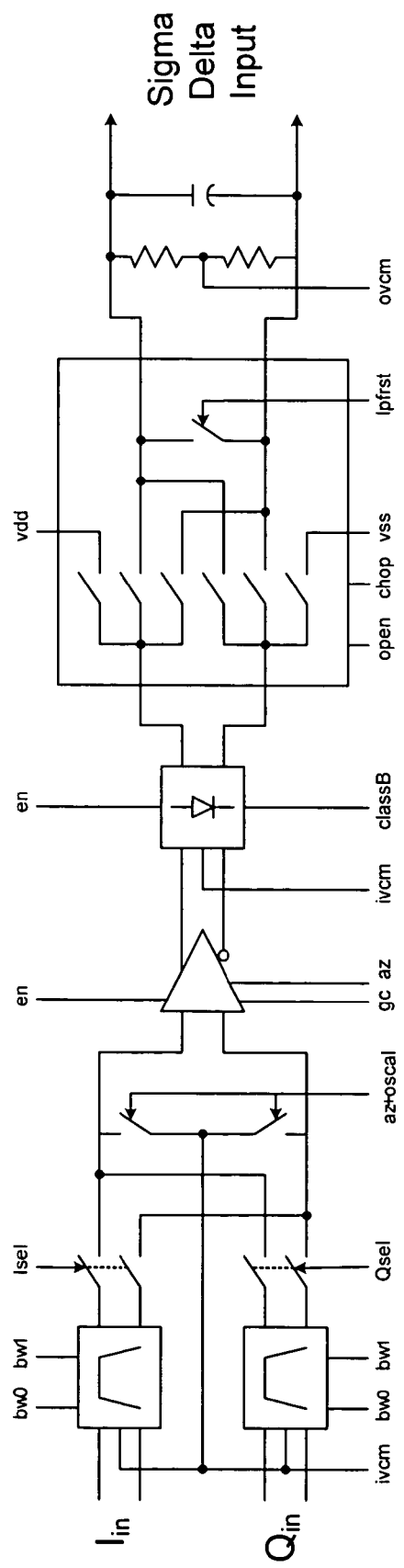
FIG. 5 shows a block diagram of the amplitude difference detector.

FIG. 5 shows a block diagram of an exemplary embodiment of amplitude difference detector 401 of FIG. 4.

The accuracy of the sum-difference circuit is crucial. In a digital implementation, this is not an issue and the sum-difference block can easily be implemented using well-known methods. In an analog implementation, the accuracy is more challenging. The path mismatch in the sum-difference block is a potential issue in an analog implementation and can cause degradation of quadrature. Using a technique forming part of the present invention, it is possible to obtain high precision with very low sensitivity to mismatch.

Figure 6:
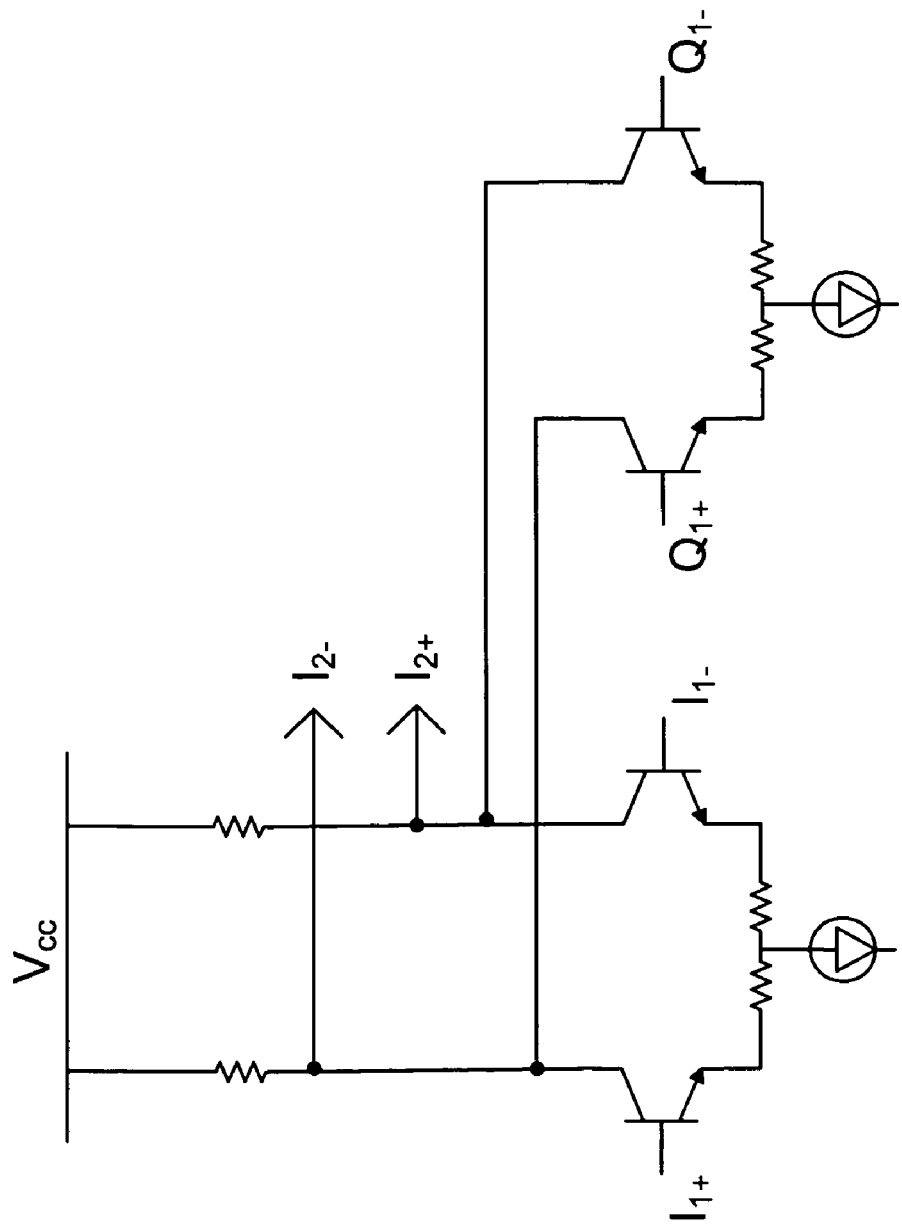
FIG. 6 shows an example implementation of a summation circuit.

FIG. 6 shows one possible implementation of a summation circuit. This circuit also functions as a difference circuit by simply swapping one set of input terminals.

The circuit uses differential signals, which is standard in baseband analog circuits. It converts the I and Q signals to currents, which then are summed and converted into a voltage again at the output. Matching of the resistors attached to the transistor collectors and emitters is critical for the accuracy and it can require very large silicon area to achieve sufficient matching. The matching of the emitter resistors is the most important. The resistor matching sets the $\alpha$ and $\beta$ factors, described below.

Figure 7:
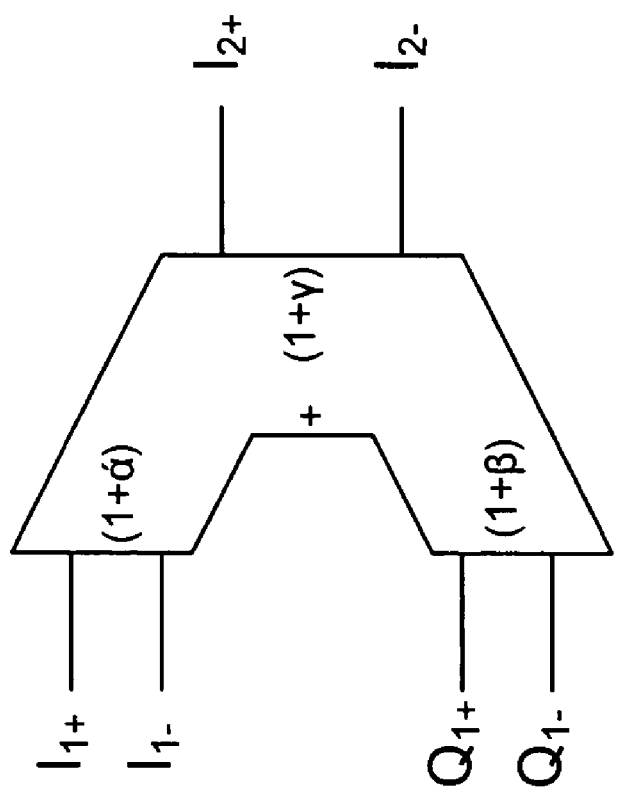
FIG. 7 shows prior art model of summation or difference circuit with mismatches.

In general the sum (or difference) function can be illustrated as shown in FIG. 7 where $\alpha$, $\beta$, and $\gamma$ represent gain errors due to mismatches in the I input circuitry, Q input circuitry, and $I_2$ output circuitry, respectively. This model is valid for any type of implementation whether using the approach of FIG. 6, or using operational amplifiers, or other implementation.

Using the well-known concept of common-mode and differential signals, we can write:

$$I_{1+}=I_{CM1}+i_1/2 \quad I_{1-}=I_{CM1}-i_1/2$$

$$Q_{1+}=Q_{CM1}+q_1/2 \quad Q_{1-}=Q_{CM1}-q_1/2$$

Where $I_{1+}$ and $I_{1-}$ are the $I_1$ differential-mode signals; $Q_{1+}$ and $Q_{1-}$ are the $Q_1$ differential signals; $I_{CM1}$ and $Q_{CM1}$ represent the common-mode voltages for $I_1$ and $Q_1$; $i_1$ and $q_1$ represents the desired differential-mode components of the I and Q signals.

The effect of the mismatches is thus:

$$i_2=(1+\gamma)((1+\alpha)i_1+(1+\beta)q_1)$$

Where $i_2$ is the desired summed signal; $\alpha$ is the mismatched gain error of the I pair; $\beta$ is the mismatched gain error of the Q pair; $\gamma$ is the mismatched gain error of the output $I_2$ pair.

The effect of $\gamma$ is insignificant because it is compensated by the following amplitude equalization block. However, minimizing the $\alpha$ and $\beta$ factors is crucial and it can require very large silicon area to achieve sufficient matching for this purpose.

It is clearly desirable to devise a method in which the $\alpha$ and $\beta$ factors have greatly reduced influence on the summation accuracy. The method used in the present invention is to swap input signals in an appropriate manner.

Figure 8:
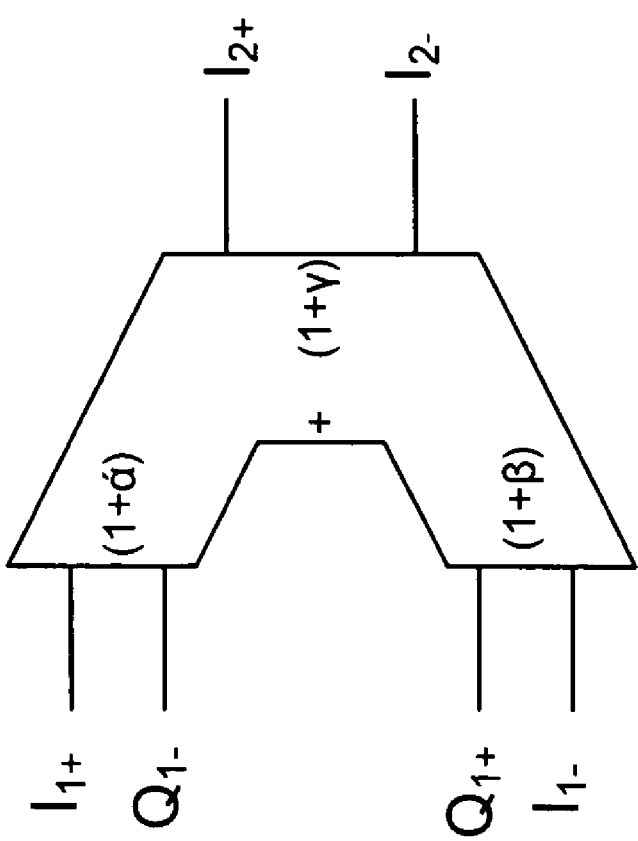
FIG. 8 shows the present invention configuration for highly accurate summation and difference circuits.

FIG. 8 illustrates the new method, where the negative signal of each input pair is crossed between summer inputs, thus it is routed to the other summer input. This results in cancellation of some errors introduced by the circuitry of the summer.

Using the configuration of FIG. 8, we obtain:

$$I_{2+} - I_{2-} = (1+\gamma)((1+\alpha)(I_{1+} - Q_{1-}) + (1+\beta)(Q_{1+} - I_{1-})) =$$

$$(1+\gamma)((1+\alpha)(I_{CM1} + i_1/2 - Q_{CM1} + q_1/2) +$$

$$(1+\beta)(Q_{CM1} + q_1/2 - I_{CM1} + i_1/2)) =$$

$$(1+\gamma)\left(1 + \frac{\alpha+\beta}{2}\right)(i_1 + q_1) + (1+\gamma)(\alpha-\beta)(I_{CM1} - Q_{CM1})$$

The I and Q signals are summed together with minimal error except for the small effect of common-mode signals as explained below. The sum of I and Q sees a slight gain error of $$(1+\gamma)\left(1 + \frac{\alpha+\beta}{2}\right),$$

which is easily corrected by the subsequent gain equalization block.

As the equation shows, we also generate a residual common-mode to differential-mode conversion. If $I_{CM1}=Q_{CM1}$ this product is null. However in practical circuits there will be a small unavoidable differential imbalance, which manifests itself as a signal component on $I_{CM1}$ and $Q_{CM1}$. However, its effect of the $I_2$ signal accuracy is negligible because the common-mode signal is normally very small and it is multiplied by a factor of $(\alpha-\beta)$, which is also very small.

The same method can be used for the difference block generating the $Q_{2+}-Q_{2-}$ signal, with $I_{1+}$ and $I_{1-}$ swapped in order to generate a subtraction as opposed to a summation.

This circuit configuration to achieve minimization of errors is independent of the underlying circuit implementation on the summation or difference blocks. It only relies on a suitable reconfiguration of differential input signals and it will thus work for any kind of circuitry and not only on the transistor-level example shown above.

Amplitude Difference Detector

FIG. 5 shows an example amplitude difference detector that is part of the amplitude equalization loop of FIG. 4. Its function is to produce an output that represents the average power or amplitude difference between the I and Q input signals. This output is used by the control block to steer the variable gain block(s) in order to equalize the I and Q amplitudes. In order to achieve high image rejection the amplitude equalization loop must be very accurate. This means that the detector must be able to measure very small amplitude differences between I and Q accurately without offset.

If the I and Q signals exist in digital form, the implementation is straightforward, using for example peak or RMS detection on I and Q followed by some averaging. This can be done using commonly known digital techniques.

In an analog or mixed implementation, the amplitude difference detection is subject to mismatches and offsets, which degrade its accuracy. Therefore, instead of using two amplitude detectors, with the mismatch and offset errors that that would entail, only one amplitude detector is used on a time-sharing basis between the I and Q channels. By time multiplexing the detector, the mismatch error caused by using two detectors is minimized.

Figure 9:
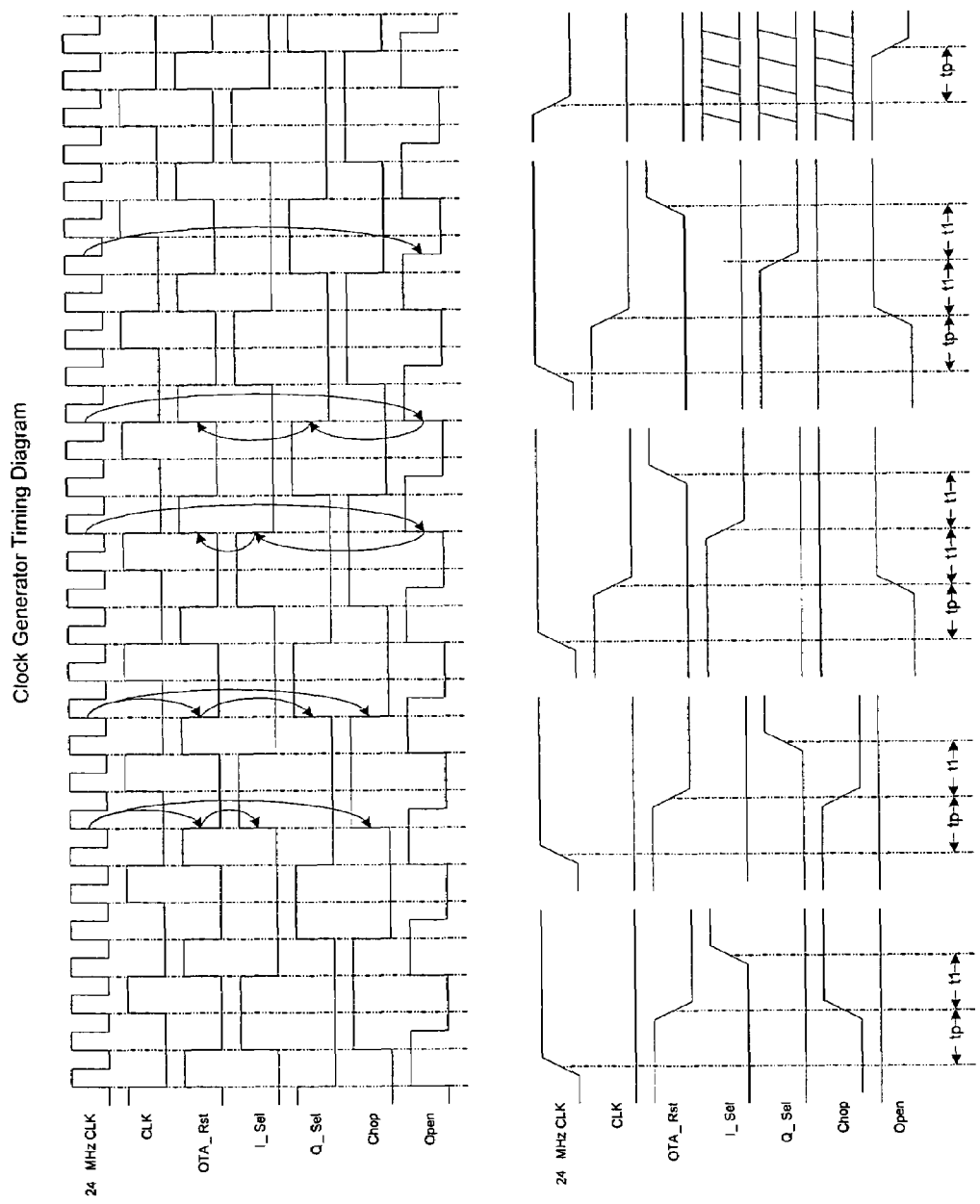
FIG. 9 shows an example timing diagram of the amplitude difference detector.

The first blocks in the analogue-input power difference detector are the two optional filters as shown in the block diagram in FIG. 5 with associated timing diagram shown in FIG. 9. Here non-overlap of certain clock-phases is important as detailed in the lower part of the figure. The filters have high pass and low pass characteristics. This filtering is in addition to any channel filtering that might precede the Iin and Qin signals. The high pass function ensures that possible DC offset of I and Q is removed so that it does not interfere with the amplitude difference measurement. The low pass function provides additional rejection of jammers if the previous channel filtering has not provided enough rejection already. Because the frequencies of the jammers are outside the channel filter pass band, the channel filter might itself create additional gain and phase imbalances of the I and Q components of the jammers and it might be important to ensure that the amplitude equalization loop equalizes the amplitude of the desired signal and not the jammers. This can be achieved by the low pass function of the optional filters. The low pass corner frequencies are selectable by control signals {bw0} and {bw1} to give adjustable insertion loss and rejection to the adjacent channel, such as sound carriers of analog television signals. If used, these filters must be well matched so that the following circuitry is measuring the mismatch in the actual I and Q signal paths and not the mismatch in the filters. The filters are optional and may not be necessary in many systems.

The filtered signals are then applied to the following optional amplifier, alternatively by the {Ise1} and {Qse1} signals that turn on and off the switches. The amplifier input (or detector input if the amplifier is not used) is auto-zeroed by the control signal {az} before switching from one channel to another. This is done to prevent cross coupling between the I and Q filters through the signal storage on the input capacitance of the amplifier. The auto-zeroing is optional but preferred.

Next, the switched I/Q signal is passed to an amplitude detector, which can be implemented in several known ways, for example as a rectifier, peak detector, squarer, or other known techniques. A current rectifier essentially consists of two rectifying class-AB mirrors, which sources or sinks current from the input and mirror it to the output. To improve the response time (which is needed because the input are current pulses), a very small quiescent current (50 nA) are biased into the input MOS transistors. To allow for flexibility, this bias can be turned off by asserting the control signal {classB}.

Now the output from the rectifier is proportional to the instantaneous absolute value of the input I or Q signals depending on which channel is connected to the optional amplifier. The switch matrix and the subsequent low pass filter performs the subtraction functions to calculate the magnitude of I minus the magnitude of Q (|I|−|Q|). To do this, the input current that represents |I| or |Q| are pumped straight or crossed into the filter, thereby performing the subtraction. There are times when the output from the rectifier does not represent the I or Q signal or has not settled yet because of device capacitances. To reduce the detection error due to these, the input current can optionally be diverted to rails during these periods and it occurs when the control signal {open-} is asserted. During other times, the switch is controlled by the {chop} signal. There is also a switch across the output, which is controlled by the control signal {lpfrst}. This can be used to zero the output, which can for example be useful for calibrating offsets.

The current from the switch matrix not only consist of the desired DC component, which is proportional to the power difference, but also other frequency components as well. These frequency components can cause aliasing and overload the sigma-delta converter. Thus, it has to be attenuated and it is done by the output low pass filter. The lower the corner frequency of this low pass filter the better.

In the implementation of FIG. 5, a current-mode implementation is used, in which the output of the rectifier is a current. However, a voltage-mode implementation could equally well be used, in which the low pass filter is a series RC connection. The low pass filter does not necessarily have to be a passive RC filter. Any type of filter, active or passive, can be used. The chopped signal could also be digitized and the filtering done in the digital domain.

To further reduce static offset at the output, an offset calibration scheme can be used. During the offset calibration mode, the inputs of the operational transconductance amplifier (OTA) is disconnected from the I and Q output and shorted to the reference voltage by the optional control signal {oscal}.

Figure 10:
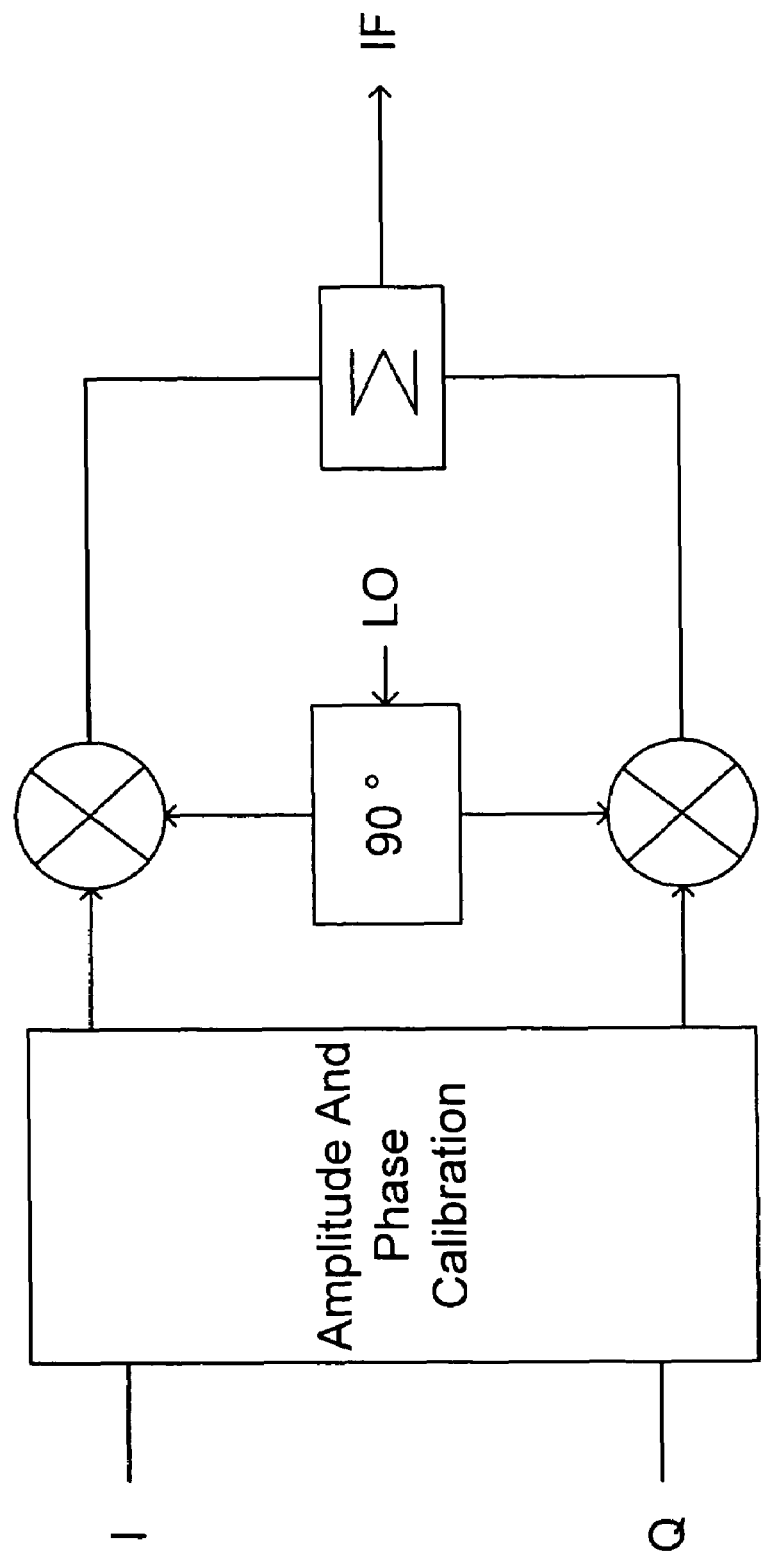
FIG. 10 shows a quadrature up converter with I and Q calibration for image rejection.

FIG. 10 shows the amplitude and phase calibration used with an up converter modulator. Alternatively, amplitude and phase calibration can be placed at the output side of the mixers. This way the errors introduced by the mixers and LO signals are also corrected. The summation block shown in the drawing can be implemented using the method from FIG. 8.

In a receiver it is preferable to have the I and Q calibration on the baseband or IF side of the mixers, RF being the input to the mixers. This way the errors introduced by the mixers will be compensated. In a transmitter the calibration is preferably on the RF output side, again to compensate mixer and LO errors.

Control Block

As FIG. 4 shows, the amplitude difference detector provides the input to the control block, which can be analog, digital, or mixed. In an analog implementation, a simple integrator can be used (continuous-time or discrete time, for example switched-capacitor). It is important that this integrator have low offset. This can be achieved either through good component matching or by using known offset cancellation techniques.

In a digital implementation, the control block can be implemented using a digital integrator.

In a mixed implementation, where the I and Q signal paths are analog but the control block is implemented digitally, it is advantageous to place the A/D conversion at the input of the control block. Several types of known A/D converter topologies may be used, however it is especially advantageous to use a $1^{st}$ order $\Sigma\Delta$ converter because of its simplicity in the analog domain as well as in the digital domain where it provides a 1 bit wide bit-stream, allowing integrators to be implemented as simple up-down counters.

What is claimed is:

1. An amplitude and phase corrector for in-phase (I) and quadrature-phase (Q) signals comprising:
   first means for amplitude balancing wherein the I and Q signals are balanced to produce amplitude balanced I and Q signals, the means for amplitude balancing comprising;
      two signal paths, at least one path comprising a variable gain element with a signal input and signal output and having a gain control input;
      an amplitude difference detector coupled to the signal paths;
      wherein the amplitude difference detector comprises:
      a switch to alternately select one of the signals;
      a peak detector coupled to the switch to detect the amplitude of the selected signal;
      a switch matrix and output filter for computing the amplitude difference between the alternately selected signals;
      control circuitry responsive to the amplitude difference detector for driving the gain control input to adjust the variable gain element to produce equal amplitude in the two signal paths;
   means for summing and differencing the amplitude balanced I and Q signals wherein phase is corrected to produce quadrature-phase signals;
   second means for amplitude balancing wherein the quadrature-phase signals are balanced to produce amplitude and phase corrected I and Q signals.

2. The amplitude difference detector of claim 1 further comprising two input filters for filtering the two signals before the signals are alternately selected by the switch.

3. The amplitude difference detector of claim 2 wherein the input filters have adjustable corner frequencies to improve rejection of signals adjacent to the signals being compared.

4. An in-phase (I) and quadrature-phase (Q) signal calibrator for use in a receiver to correct phase and amplitude errors between the I and Q signals output from a quadrature down converter, the signal calibrator comprising
   a first amplitude balancer wherein the I and Q signals are balanced to produce amplitude balanced I and Q signals, the first amplitude balancer including;
      two gain elements each with a signal input and signal output, at least one gain element being variable and having a gain control input;
      an amplitude difference detector coupled to the two gain element signal outputs;
      wherein the amplitude difference detector comprises:
      a switch to alternately select one of the signals;
      a peak detector coupled to the switch to detect the amplitude of the selected signal;
      a switch matrix and output filter for computing the amplitude difference between the alternately selected signals;
      control circuitry responsive to the amplitude difference detector for driving the gain control input to adjust the variable gain to cause the amplitude of the signal output from two gain elements to be equal;
   a summer and a differencer applied to the amplitude balanced I and Q signals wherein phase is corrected to produce quadrature-phase signals; and
   a second amplitude balancer wherein the quadrature-phase signals are balanced to produce amplitude and phase corrected I and Q signals.

5. The amplitude difference detector of claim 4 further comprising two input filters for filtering the two signals before the signals are alternately selected by the switch.

6. The amplitude difference detector of claim 5 wherein the input filters have adjustable corner frequencies to improve rejection of signals adjacent to the signals being compared.

7. An image rejection quadrature modulator for converting in-phase (I) and quadrature-phase (Q) baseband signals to a radio frequency (RF) signal comprising:
   means for I and Q local oscillator (LO) generation;
   first means for amplitude balancing wherein the I and Q signals are balanced to produce amplitude balanced I and Q signals;
      the means for amplitude balancing comprising;
      two signal paths, at least one path comprising a variable gain element with a signal input and signal output and having a gain control input;
      an amplitude difference detector coupled to the signal paths;
      control circuitry responsive to the amplitude difference detector for driving the gain control input to adjust the variable gain element to produce equal amplitude in the two signal paths;
   means for summing and differencing the amplitude balanced I and Q signals wherein phase is corrected to produce quadrature-phase signals;
   second means for amplitude balancing wherein the quadrature-phase signals are balanced to produce amplitude and phase corrected I and Q signals;
   mixing means to mix the balanced I signal with the I LO and Q signal with the Q LO;
   and means for summing the mixed I and Q signals;
whereby a spectral image of the input baseband signals is rejected in the RF signal.

* * * * *